(12) United States Patent
Lee et al.

(10) Patent No.: US 9,212,420 B2
(45) Date of Patent: Dec. 15, 2015

(54) CHEMICAL VAPOR DEPOSITION METHOD

(75) Inventors: Eric M. Lee, Austin, TX (US);
Raymond Nicholas Vrtis, Orefield, PA (US); Mark Leonard O'Neill, San Marcos, CA (US); Patrick Timothy Hurley, Allentown, PA (US); Jacques Faguet, Albany, NY (US); Takashi Matsumoto, Tokyo (JP); Osayuki Akiyama, Rensselaer, NY (US)

(73) Assignee: Tokyo Electron Limited, Tokyo (JP)

( * ) Notice: Subject to any disclaimer, the term of this patent is extended or adjusted under 35 U.S.C. 154(b) by 991 days.

(21) Appl. No.: 12/730,088

(22) Filed: Mar. 23, 2010

(65) Prior Publication Data
US 2010/0247803 A1    Sep. 30, 2010

Related U.S. Application Data

(60) Provisional application No. 61/162,947, filed on Mar. 24, 2009.

(51) Int. Cl.
| | |
|---|---|
| C23C 16/00 | (2006.01) |
| C23C 16/30 | (2006.01) |
| C23C 16/40 | (2006.01) |
| C23C 16/455 | (2006.01) |
| C23C 16/46 | (2006.01) |
| C23C 16/18 | (2006.01) |
| C23C 16/56 | (2006.01) |

(52) U.S. Cl.
CPC .............. *C23C 16/30* (2013.01); *C23C 16/18* (2013.01); *C23C 16/401* (2013.01); *C23C 16/4557* (2013.01); *C23C 16/46* (2013.01); *C23C 16/56* (2013.01)

(58) Field of Classification Search
USPC .......... 427/69, 255.23, 255.28, 255.18, 248.1
See application file for complete search history.

(56) References Cited

U.S. PATENT DOCUMENTS

| | | | |
|---|---|---|---|
| 5,888,591 A | 3/1999 | Gleason et al. | |
| 6,045,877 A | 4/2000 | Gleason et al. | |
| 6,887,578 B2 | 5/2005 | Gleason et al. | |
| 2004/0137243 A1 | 7/2004 | Gleason et al. | |
| 2004/0175501 A1* | 9/2004 | Lukas et al. | 427/255.28 |
| 2004/0175957 A1 | 9/2004 | Lukas et al. | |
| 2004/0197474 A1* | 10/2004 | Vrtis et al. | 427/255.28 |
| 2004/0249006 A1 | 12/2004 | Gleason et al. | |
| 2006/0078676 A1* | 4/2006 | Lukas et al. | 427/248.1 |
| 2006/0281881 A1 | 12/2006 | Van Den Berg et al. | |
| 2007/0299239 A1* | 12/2007 | Weigel et al. | 528/349 |
| 2008/0182397 A1 | 7/2008 | Lam et al. | |

OTHER PUBLICATIONS

R. F. Severson, W. H. Schuller & R. V. Lawrence, "The Pyrolysis of Cumene, p-Cymene, and alpha-Methylstyrene", Canadian Journal of Chemistry, 1971, 49, 4023.

(Continued)

*Primary Examiner* — Dah-Wei D Yuan
*Assistant Examiner* — Nga Leung V Law

(57) ABSTRACT

A chemical vapor deposition (CVD) method for depositing a thin film on a surface of a substrate is described. The CVD method comprises disposing a substrate on a substrate holder in a process chamber, and introducing a process gas to the process chamber, wherein the process gas comprises a chemical precursor. The process gas is exposed to a non-ionizing heat source separate from the substrate holder to cause decomposition of the chemical precursor. A thin film is deposited upon the substrate.

23 Claims, 10 Drawing Sheets

(56) References Cited

OTHER PUBLICATIONS

L. S. Loo & K. K. Gleason, "Hot Filament Chemical Vapor Deposition of Polyoxymethylene as a Sacrificial Layer for Fabircating Air Gaps", Electrochemical Society and Solid-State Letters, 2001, 4 (11), G81-G84.

Y. L. Lee & J. M. Sanchez, "Theoretical Study of Thermodynamics Relevant to Tetramethylsilane Pyrolysis", Journal of Crystal Growth, 1997, 178, 513-517.

H. G. P. Lewis, T. B. Casserly & K. K. Gleason, "Hot-Filament Chemical Vapor Deposition of Organosilicon Thin Films from Hexamethylcyclotrisiloxane and Octamethylcyclotetrasiloxane", Journal of the Electrochemical Society, 2001, 148 (12), F212-F220.

A. Grill & V. Patel, "Novel Low-k Dual-Phase Materials Prepared by PECVD", Mat. Res. Soc. Symp. Proc., 2000, 612, D2.9.1-D2.9.7.

K. K. S. Lau, H. G. P. Lewis, S. J. Limb, M. C. Kwan & K. K. Gleason, "Hot-Wire Chemical Vapor Deposition (HWCVD) of Fluorocarbon and Organosilicon Thin Films", Thin Solid Films, 2001, 395, 288-291.

K. Takatsuji, M. Kawakami, Y. Makita, K. Murakami, H. Nakayama, Y. Miura, N. Shimoyama & H. Machida, "Characterization of Cat-CVD Grown Si—C and Si—C—O Dielectric Films for ULSI Applications", Thin Solid Films, 2003, 430, 116-119.

H. Hakayama & T. Hata, "Low-Temperature Growth of Si-Based Organic-Inorganic Hybrid Materials, Si—O—C and Si—N—C, by Organic Cat-CVD", Thin Solid Films, 2006, 501, 190-194.

T. B. Casserly, "Chemical Vapor Deposition of Organosilicon and Sacrificial Polymer Thin Films", Ph.D. Thesis, Massachusetts Institute of Technology, 2005, 163 pages.

International Searching Authority, International Search Report and Written Opinion, International Application No. PCT/US2010/028377, Mailed May 4, 2010, (10 pages).

W. E. Tenhaeff & K. K. Gleason, "Initiated and Oxidative CVD of Polymeric Thin Films", Adv. Funct. Mater., 2008, 18, 979-992.

S. H. Baxamusa, S. G. Im & K. K. Gleason, "Initiated and Oxidative Chemical Vapor Deposition: A Scalable Method for Conformal and Functional Polymer Films on Real Substrates", Phys. Chem. Chem. Phys., 2009, 11, 5227-5240.

R. Sreenivasan & K. K. Gleason, "Overview of Strategies for the CVD of Organic Films and Functional Polymer Layers", Chem. Vap. Deposition, 2009, 15, 77-90.

* cited by examiner

CHEMICAL VAPOR DEPOSITION METHOD

CROSS-REFERENCE TO RELATED APPLICATIONS

This application is related to and claims priority to U.S. provisional application Ser. No. 61/162,947 filed on Mar. 24, 2009; the entire content of which is herein incorporated by reference.

BACKGROUND OF THE INVENTION

1. Field of the Invention

The invention relates to a chemical vapor deposition method for depositing thin film on a substrate and, more particularly, to a chemical vapor deposition method for depositing a Si-containing material, an organic material, a graded organosilicon-containing material, or a mixture thereof on a substrate.

2. Description of Related Art

As is known to those in the semiconductor art, interconnect delay is a major limiting factor in the drive to improve the speed and performance of integrated circuits (IC). One way to minimize interconnect delay is to reduce inter-connect capacitance by using low dielectric constant (low-k) materials as the insulating dielectric for metal wires in the IC devices. Thus, in recent years, low-k materials have been developed to replace relatively high dielectric constant insulating materials, such as silicon dioxide. In particular, low-k films are being utilized for inter-level and intra-level dielectric layers between metal wires in semiconductor devices.

Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes. However, low-k films and, more specifically, porous low-k films have suffered integration problems including, but not limited to, poor thermal and mechanical performance, copper migration, damage during pattern etching, etc.

Furthermore, in yet another attempt to reduce the dielectric constant of insulating materials, air-gap structures are contemplated. According to one approach, air-gap structures are formed by depositing a sacrificial material on a substrate and then depositing a bridging material over the sacrificial material. Thereafter, at a later point in the device manufacturing process following metallization and planarization, the sacrificial material is decomposed and removed in order to leave a gap or void in its absence.

As an example, FIGS. 1A through 1E illustrate a procedure for preparing an air gap structure 5. As shown in FIG. 1A, the procedure comprises forming an inter-level dielectric (ILD) layer 10 on a substrate (not shown). Thereafter, a sacrificial layer 20 is formed on the ILD layer 10, and a cap layer 30 is formed on the sacrificial layer 20. In FIG. 1B, a pattern 40 is transferred to the sacrificial layer 20 and the cap layer 30 using, for instance, a series of lithography and etching processes. The pattern 40 may correspond to the metal line pattern to be formed on the ILD layer 10.

In FIG. 1C, the pattern 40 is metalized to form a metal interconnect 50. The metal interconnect 50 may comprise metal lines 52, and a barrier layer 54 disposed between the metal lines 52 and the sacrificial layer 20 and the cap layer 30. For instance, the barrier layer 54 may reduce migration of the metal from metal lines 52 to the sacrificial layer 20 and the cap layer 30. The metallization of pattern 40 may comprise a series of deposition processes, and a planarization or polishing process.

In FIG. 1D, the sacrificial layer 20 is decomposed and removed from air gap structure 5 to leave air gaps 22. Thereafter, as shown in FIG. 1E, a metal line cap layer 12 may be formed and a second ILD layer 14 may be formed on the metal line cap layer 12. Conventionally, the sacrificial layer 20 is removed using a chemical or thermal process. Thus, the sacrificial layer 20 plays the role of template or "void precursor", wherein the void is formed upon decomposition of the sacrificial material by thermal treatment and diffusion of the decomposition products out of the multilayer assembly. Thermally degradable polymers have been a preferred choice for use as a sacrificial material.

A common technique for forming porous or non-porous low-k or ultra-low-k films for use in conventional metal interconnects or advanced metal interconnects incorporating air-gap structures includes a vapor deposition process. Vapor deposition processes may include chemical vapor deposition (CVD) and plasma enhanced CVD (PECVD). For example, in a CVD process, a continuous stream of film precursor vapor is introduced to a process chamber containing a substrate, wherein the composition of the film precursor has the principal atomic or molecular species found in the film to be formed on the substrate. During this continuous process, the precursor vapor is chemisorbed on the surface of the substrate while it thermally decomposes and reacts with or without the presence of an additional gaseous component that assists the reduction of the chemisorbed material, thus, leaving behind the desired film. However, when using CVD processes, the substrate temperature necessary for thermally decomposing the precursor vapor can be very high, generally in excess of 400 degrees C. which, among other things, adds to the thermal budget for the substrate.

Additionally, for example, in a PECVD process, the CVD process further includes plasma that is utilized to alter or enhance the film deposition mechanism. For instance, plasma excitation can allow film-forming reactions to proceed at temperatures that are lower than those typically required to produce a similar film by thermally excited CVD. In addition, plasma excitation may activate film-forming chemical reactions that are not energetically or kinetically favored in thermal CVD. However, when using PECVD processes, the substrate temperature may still be high and its contribution to the thermal budget for the substrate may be excessive. Further, the use of plasma can lead to plasma-induced damage, including both physical and/or electrical damage arising from ion bombardment. Moreover, the use of plasma leads to uncontrolled dissociation of the precursor vapor, which, among other things, leads to poor film morphology.

SUMMARY OF THE INVENTION

The invention relates to a chemical vapor deposition method for depositing a thin film on a substrate. Additionally, the invention relates to a chemical vapor deposition method for depositing a Si-containing material on a substrate. Additionally yet, the invention relates to a chemical vapor deposition method for depositing an organic material on a substrate. Furthermore, the invention relates to a chemical vapor deposition method for depositing a graded organosilicon-containing material on a substrate.

According to an embodiment, a chemical vapor deposition (CVD) method for depositing a thin film on a surface is described. The CVD method comprises disposing a substrate on a substrate holder in a process chamber, and introducing a process gas to the process chamber, wherein the process gas comprises one or more chemical precursors selected from the group consisting of a Si-containing chemical precursor and an organic precursor. The process gas is exposed to a non-ionizing heat source separate from the substrate holder to cause decomposition of the one or more chemical precursors. The substrate is exposed to the decomposition of the one or more chemical precursors. A thin film is deposited upon the substrate, wherein the thin film contains a material selected from the group consisting of a Si-containing material, an organic material, a graded organosilicon-containing material, or a mixture of two or more thereof.

DETAILED DESCRIPTION OF EXEMPLARY EMBODIMENTS

Figure 1A:
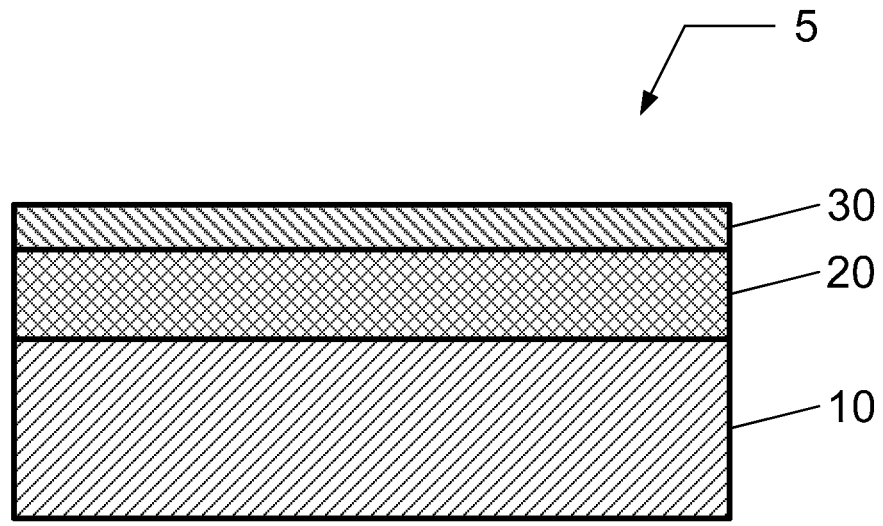
FIGS. 1A through 1E illustrate a method of preparing an air gap structure.
Figure 1B:
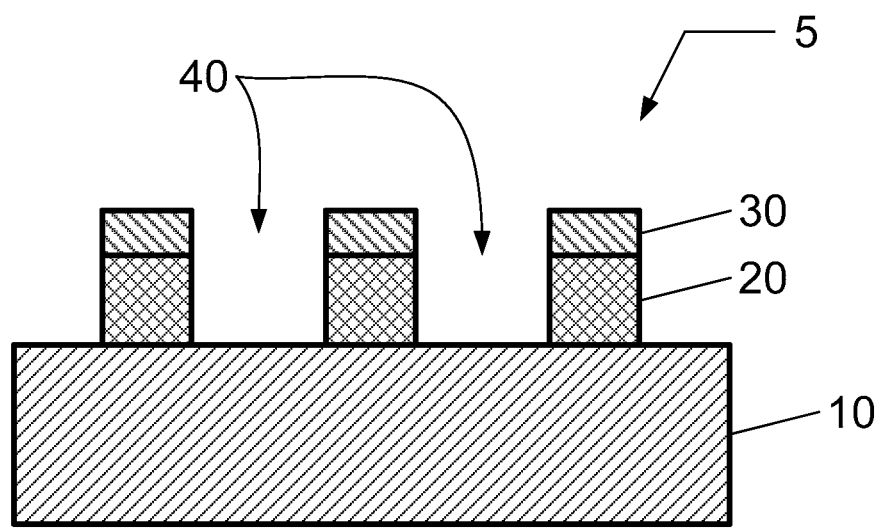
Figure 1C:
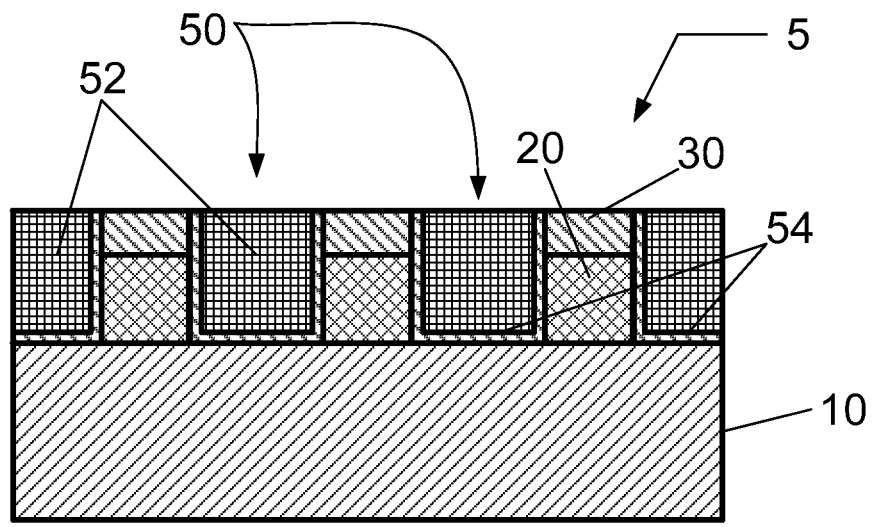
Figure 1D:
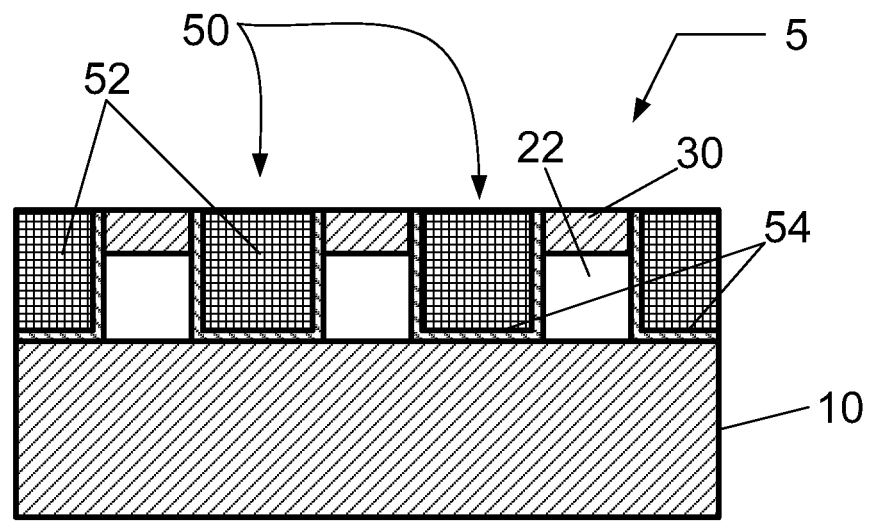
Figure 1E:
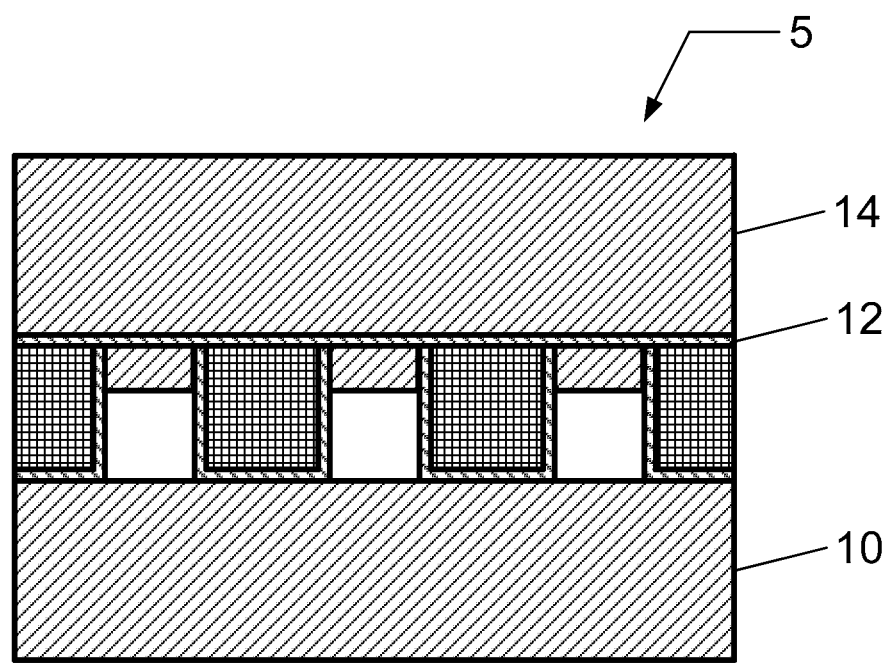

A method of depositing a thin film on a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

According to an embodiment, a method of depositing a thin film, such as a Si-containing material, or an organic material, or a mixed Si-containing and organic-containing (i.e., graded organosilicon-containing) material, or a mixture of two or more thereof, on a surface of a substrate is described. For example, the Si-containing material may be utilized, among other things, as an inter-level dielectric layer in a metal interconnect or a cap layer in connection with an air gap structure for use in a metal interconnect as depicted in FIGS. 1A through 1E. Other applications for the Si-containing material include a hard mask layer, an etch stop layer, a chemical-mechanical planarization (CMP) stop layer, an anti-reflective coating (ARC) layer, a dielectric barrier layer, etc. Additionally, for example, the organic material may be utilized, among other things, as a sacrificial layer in an air gap structure for use in a metal interconnect as depicted in FIGS. 1A through 1E. Furthermore, for example, the graded organosilicon-containing material may be utilized, among other things, as a transition layer between a sacrificial layer (e.g., organic layer) and a cap layer (e.g., silicon-containing layer) in an air gap structure for use in a metal interconnect as depicted in FIGS. 1A through 1E. The transition layer may improve adhesion between adjacent organic layers and Si-containing layers.

Figure 2:
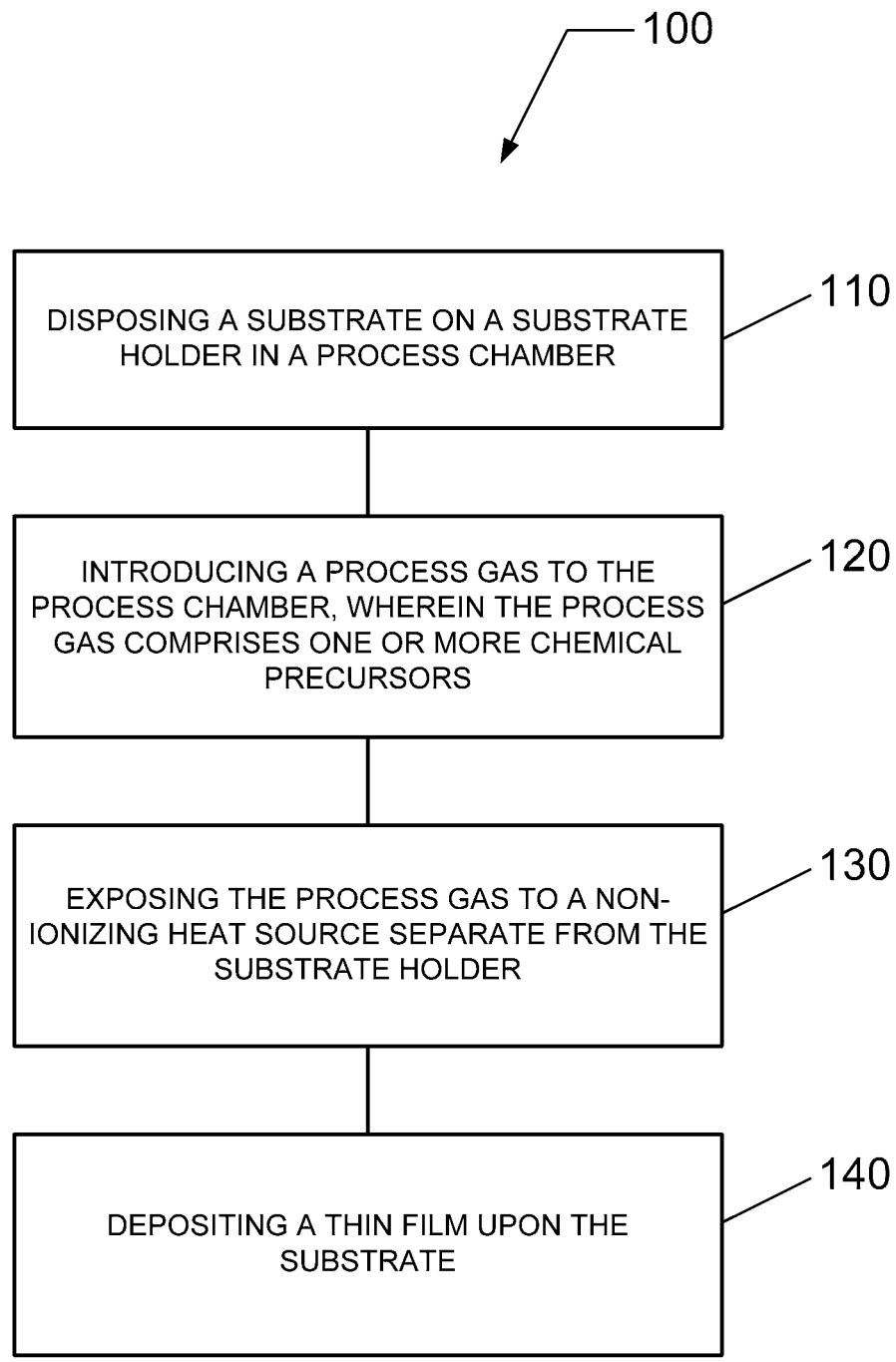
FIG. 2 is a flow chart of a method of depositing a thin film on a substrate according to an embodiment.
Figure 3:
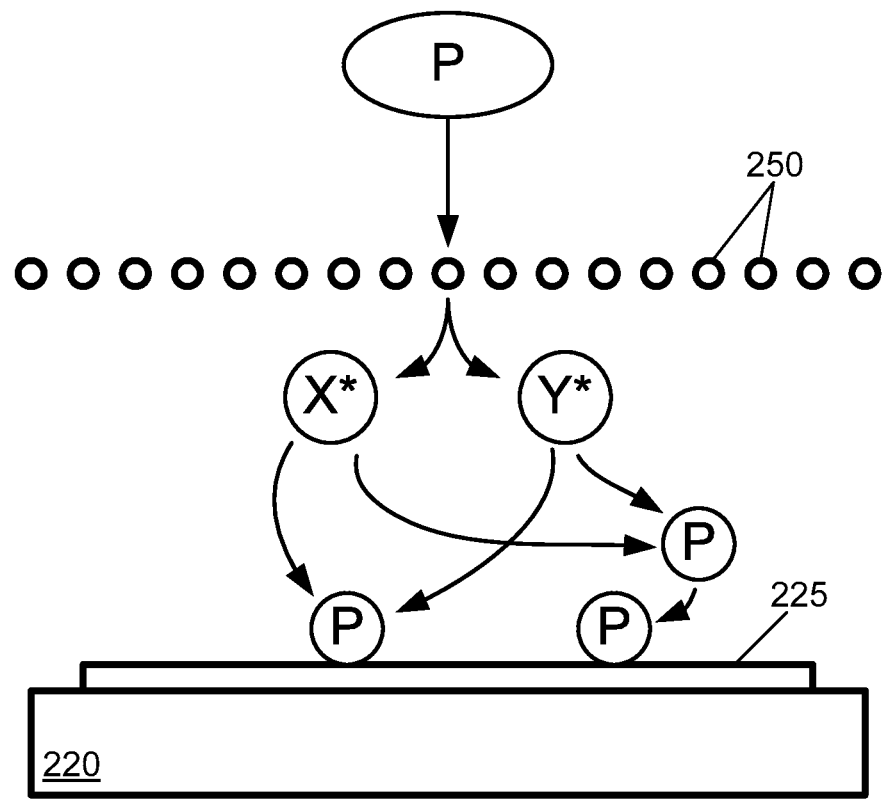
FIG. 3 illustrates a method of depositing a thin film on a substrate according to an embodiment.

FIGS. 2 and 3 present a method for depositing a thin film, such as a Si-containing material, or an organic material, or a graded organosilicon-containing material, or a mixture of two or more thereof, on a substrate using a filament-assisted chemical vapor deposition process. The filament-assisted chemical vapor deposition process comprises, among other things, process conditions that improve thermal budget (e.g., lower substrate temperature relative to CVD and PECVD processes), a reduction of plasma-induced damage (e.g., no plasma unlike PECVD), and an improvement to film morphology (e.g., larger molecular fragments via pyrolysis unlike plasma-induced dissociation in PECVD).

Referring to FIG. 2, the method comprises a flow chart 100 beginning in 110 with disposing a substrate on a substrate holder in a process chamber. The substrate comprises a surface upon which the thin film, e.g., Si-containing material, or organic material, or graded organosilicon-containing material, is deposited. The silicon-containing material may include a silicon-containing dielectric material, such as a porous or non-porous low dielectric constant (low-k) dielectric material or an ultra-low-k dielectric material. For example, the silicon-containing material may include a SiCOH-containing material. The organic material may include a decomposable organic material.

In 120, a process gas is introduced to the chemical vapor deposition system, wherein the process gas comprises a silicon (Si)-containing chemical precursor for depositing a Si-containing material, or an organic chemical precursor for depositing an organic material, or both a Si-containing chemical precursor and an organic chemical precursor for depositing a graded organosilicon-containing material. The Si-containing chemical precursor may include one or more compounds suitable for depositing the Si-containing material on the substrate. The organic chemical precursor may include one or more compounds suitable for depositing the organic material on the substrate.

The Si-containing chemical precursor may include a compound possessing a Si-containing structure-forming molecule having a pore-generating molecular side group (e.g., attached porogen) weakly bonded to the Si-containing structure-forming molecule. Alternatively, the Si-containing chemical precursor may include a first compound possessing a Si-containing structure-forming molecule and a second compound possessing a pore-generating molecule (e.g., unattached porogen), wherein there is no bond between the pore-generating molecule and the Si-containing structure forming molecule. In either embodiment, bonded or un-bonded, the pore-generating molecule may comprise an organic material.

The following are non-limiting examples of Si-containing chemical precursors suitable for use with a distinct porogen according to the present invention. In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R^1_n(OR^2)_{4-n}Si$, when n is 2 or 3, the two or three $R^1$ groups need not be identical to each other or to $R^2$.

$R^1_n(OR^2)_{4-n}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated; and n is 1 to 3.

Example: diethoxymethylsilane, dimethyldimethoxysilane $R^1_n(OR^2)_{3-n}Si-O-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently $C_1$ to $C_6$, linear or branched, saturated, singly or multiply unsaturated, cyclic, aromatic, partially or fully fluorinated; n is 1 to 3; and m is 1 to 3.

Example: 1,3-dimethyl-1,3-diethoxydisiloxane $R^1_n(OR^2)_{3-n}Si-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated, $R^2$ and $R^4$ can be independently $C_1$ to $C_6$, linear or branched, saturated, singly or multiply unsaturated, cyclic, aromatic, partially or fully fluorinated; n is 1 to 3; and m is 1 to 3.

Example: 1,2-dimethyl-1,1,2,2-tetraethoxydisilane $R^1_n(O(O)CR^2)_{4-n}Si$ where $R^1$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated; and n is 1 to 3.

Example: dimethyldiacetoxysilane $R^1_n(O(O)CR^2)_{3-n}Si-O-SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated; n is 1 to 3; and m is 1 to 3.

Example: 1,3-dimethyl-1,3-diacetoxydisiloxane $R^1_n(O(O)CR^2)_{3-n}Si-SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated; n is 1 to 3; and m is 1 to 3.

Example: 1,2-dimethyl-1,1,2,2-tetraacetoxydisilane $R^1_n(O(O)CR^2)_{3-n}Si-O-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated; $R^4$ can be independently $C_1$ to $C_6$, linear or branched, saturated, singly or multiply unsaturated, cyclic, aromatic, partially or fully fluorinated; n is 1 to 3; and m is 1 to 3.

Example: 1,3-dimethyl-1-acetoxy-3-ethoxydisiloxane $R^1_n(O(O)CR^2)_{3-n}Si-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated; $R^4$ can be independently $C_1$ to $C_6$, linear or branched, saturated, singly or multiply unsaturated, cyclic, aromatic, partially or fully fluorinated; n is 1 to 3; and m is 1 to 3.

Example: 1,2-dimethyl-1-acetoxy-2-ethoxydisilane $R^1_n(OR^2)_p(O(O)CR^4)_{4-(n+p)}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated; $R^4$ can be independently H, $C_1$ to $C_6$, linear or branched, saturated, singly or multiply unsaturated, cyclic, aromatic, partially or fully fluorinated; n is 1 to 3; and p is 1 to 3.

Example: methylacetoxy-t-butoxysilane $R^1_n(OR^2)_p(O(O)CR^4)_{3-n-p}Si-O-SiR^3_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$ and $R^6$ can be independently $C_1$ to $C_6$, linear or branched, saturated, singly or multiply unsaturated, cyclic, aromatic, partially or fully fluorinated; $R^4$ and $R^5$ can be independently H, $C_1$ to $C_6$, linear or branched, saturated, singly or multiply unsaturated, cyclic, aromatic, partially or fully fluorinated; n is 1 to 3; m is 1 to 3; p is 1 to 3; and q is 1 to 3.

Example: 1,3-dimethyl-1,3-diacetoxy-1,3-diethoxydisiloxane $R^1_n(OR^2)_p(O(O)CR^4)_{3-n-p}Si-SiR^3_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$, $R^6$ can be independently $C_1$ to $C_6$, linear or branched, saturated, singly or multiply unsaturated, cyclic, aromatic, partially or fully fluorinated; $R^4$, $R^5$ can be independently H, $C_1$ to $C_6$, linear or branched, saturated, singly or multiply unsaturated, cyclic, aromatic, partially or fully fluorinated; n is 1 to 3; m is 1 to 3; p is 1 to 3; and q is 1 to 3.

Example: 1,2-dimethyl-1,2-diacetoxy-1,2-diethoxydisilane cyclic siloxanes of the formula $(OSiR^1R^2)_x$, where $R^1$ and $R^2$ can be independently H, $C_1$ to $C_4$, linear or branched, saturated, singly or multiply unsaturated, cyclic, partially or fully fluorinated; and x may be any integer from 2 to 8.

Examples: 1,3,5,7-tetramethylcyclotetrasiloxane, octamethylcyclotetrasiloxane

Provisos to all above precursor groups: 1) a porogen is added to the reaction mixture, and 2) a curing (e.g., anneal) step is used to remove substantially all of the included porogen from the deposited material to produce a dielectric constant k<2.6.

The above precursors may be mixed with porogen or have attached porogens, and may be mixed with other molecules of these classes and/or with molecules of the same classes except where n and/or m are from 0 to 3.

Examples: TEOS, triethoxysilane, di-tertiarybutoxysilane, silane, disilane, di-tertiarybutoxydiacetoxysilane, etc.

The following are additional formulas representing certain Si-containing chemical precursors suitable for use with a distinct porogen according to the present invention:

(a) the formula $R^1{}_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; $R^3$ is independently H, $C_1$ to $C_6$ linear or branched, saturated, singly or multiply unsaturated, cyclic, aromatic, partially or fully fluorinated hydrocarbon; n is 1 to 3; and p is 0 to 3;

(b) the formula $R^1{}_n(OR^2)_p(O(O)CR^4)_{3-n-p}Si\text{—}O\text{—}SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon; $R^4$ and $R^5$ are independently H, $C_1$ to $C_6$ linear or branched, saturated, singly or multiply unsaturated, cyclic, aromatic, partially or fully fluorinated hydrocarbon; n is 0 to 3; m is 0 to 3; q is 0 to 3; and p is 0 to 3; provided that $n+m \geq 1$, $n+p \leq 3$ and $m+q \leq 3$;

(c) the formula $R^1{}_n(OR^2)_p(O(O)CR^4)_{3-n-p}Si\text{—}SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon; $R^4$ and $R^5$ are independently H, $C_1$ to $C_6$ linear or branched, saturated, singly or multiply unsaturated, cyclic, aromatic, partially or fully fluorinated hydrocarbon; n is 0 to 3; m is 0 to 3; q is 0 to 3; and p is 0 to 3; provided that $n+m \geq 1$, $n+p \leq 3$ and $m+q \leq 3$;

(d) the formula $R^1{}_n(OR^2)_p(O(O)CR^4)_{3-n-p}Si\text{—}R^7\text{—}SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon; $R^4$ and $R^5$ are independently H, $C_1$ to $C_6$ linear or branched, saturated, singly or multiply unsaturated, cyclic, aromatic, partially or fully fluorinated hydrocarbon; n is 0 to 3; m is 0 to 3; q is 0 to 3; and p is 0 to 3; provided that $n+m \geq 1$, $n+p \leq 3$, and $m+q \leq 3$;

(e) the formula $(R^1{}_n(OR^2)_p(O(O)CR^3)_{4-(n+p)}Si)_t CH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; $R^3$ is independently H, $C_1$ to $C_6$ linear or branched, saturated, singly or multiply unsaturated, cyclic, aromatic, partially or fully fluorinated hydrocarbon; n is 1 to 3; p is 0 to 3; and t is 2 to 4; provided that $n+p \leq 4$;

(f) the formula $(R^1{}_n(OR^2)_p(O(O)CR^3)_{4-(n+p)}Si)_t NH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; $R^3$ is independently H, $C_1$ to $C_6$ linear or branched, saturated, singly or multiply unsaturated, cyclic, aromatic, partially or fully fluorinated hydrocarbon; n is 1 to 3; p is 0 to 3; and t is 1 to 3; provided that $n+p \leq 4$;

(g) cyclic siloxanes of the formula $(OSiR^1R^2)_x$, where $R^1$ and $R^2$ are independently H, $C_1$ to $C_4$, linear or branched, saturated, singly or multiply unsaturated, cyclic, partially or fully fluorinated, and x may be any integer from 2 to 8;

(h) cyclic silazanes of the formula $(NR^1SiR^1R^2)_x$, where $R^1$ and $R^2$ are independently H, $C_1$ to $C_4$, linear or branched, saturated, singly or multiply unsaturated, cyclic, partially or fully fluorinated, and x may be any integer from 2 to 8; and (i) cyclic carbosilanes of the formula $[(CR^1R^2)(SiR^1R^2)]_x$, where $R^1$ and $R^2$ are independently H, $C_1$ to $C_4$, linear or branched, saturated, singly or multiply unsaturated, cyclic, partially or fully fluorinated, and x may be any integer from 2 to 8.

Although reference is made throughout the specification to siloxanes and disiloxanes as precursors and porogenated precursors, it should be understood that the invention is not limited thereto, and that other siloxanes, such as trisiloxanes and other linear siloxanes of even greater length, are also within the scope of the invention.

The above precursors may be mixed with other molecules of these same classes and/or with molecules of the same classes except where n and/or m are from 0 to 3.

The following are non-limiting examples of materials suitable for use as porogens when forming a Si-containing material or as an organic precursor when forming an organic material according to several embodiments:

1) Cyclic hydrocarbons of the general formula $C_nH_{2n}$, where n=4-14, where the number of carbons in the cyclic structure is between 4 and 10, and where there can be a plurality of simple or branched hydrocarbons substituted onto the cyclic structure.

Examples include: cyclohexane, trimethylcyclohexane, 1-methyl-4(1-methylethyl)cyclohexane, cyclooctane, methylcyclooctane, etc.

2) Linear or branched, saturated, singly or multiply unsaturated hydrocarbons of the general formula $C_nH_{(2n+2)-2y}$, where n=2-20, and where y=0-n.

Examples include: ethylene, propylene, acetylene, neohexane, etc.

3) Singly or multiply unsaturated cyclic hydrocarbons of the general formula $C_nH_{2n-2x}$ where x is the number of unsaturated sites in the molecule, n=4-14, where the number of carbons in the cyclic structure is between 4 and 10, and where there can be a plurality of simple or branched hydrocarbons substituted onto the cyclic structure. The unsaturation can be located inside endocyclic or on one of the hydrocarbon substituents to the cyclic structure.

Examples include cyclohexene, vinylcyclohexane, dimethylcyclohexene, t-butylcyclohexene, alpha-terpinene, pinene, 1,5-dimethyl-1,5-cyclooctadiene, vinyl-cyclohexene, para-cymene, diethylbenzene, etc.

4) Bicyclic hydrocarbons of the general formula $C_nH_{2n-2}$, where n=4-14, where the number of carbons in the bicyclic structure is between 4 and 12, and where there can be a plurality of simple or branched hydrocarbons substituted onto the cyclic structure.

Examples include, norbornane, spiro-nonane, decahydronaphthalene, etc.

5) Multiply unsaturated bicyclic hydrocarbons of the general formula $C_nH_{2n-(2+2x)}$ where x is the number of unsaturated sites in the molecule, n=4-14, where the number of carbons in the bicyclic structure is between 4 and 12, and where there can be a plurality of simple or branched hydrocarbons substituted onto the cyclic structure. The unsaturation can be located inside endocyclic or on one of the hydrocarbon substituents to the cyclic structure.

Examples include camphene, norbornene, norbornadiene, etc.

6) Tricyclic hydrocarbons of the general formula $C_nH_{2n-4}$, where n=4-14, where the number of carbons in the tricyclic structure is between 4 and 12, and where there can be a plurality of simple or branched hydrocarbons substituted onto the cyclic structure.

Examples include adamantane.

The process gas may further include an inert gas, such as a noble gas. The process gas may exclude an oxidizing agent. Alternatively, the process gas may include an oxidizing agent. Furthermore, the process gas may exclude an initiator. Alternatively, the process gas may include an initiator. Further yet, the process gas may include both an oxidizing agent and an initiator. The initiator may be a material which causes chain polymerization. In chain polymerization, the initiator generates active species to attack a monomer. The active species may be a free radical, an anion, or a cation. For example, the initiator may include a peroxide. Additionally, for example, the initiator may include: an organic peroxide, such as di-tert-butyl peroxide, di-tert-amyl peroxide, or tert-butyl peroxybenzoate; an azo compound, such as 2,2'-azobisisobutyronitrile; or another monomer, such as perfluorooctane sulfonyl fluoride.

In 130, the method comprises exposing the process gas to a non-ionizing heat source separate from the substrate holder. The non-ionizing heat source may be configured to pyrolize (i.e., produce gaseous phase molecular fragments) one or more species in the chemical precursor. For example, the non-ionizing heat source may be elevated to a heat source temperature sufficient to pyrolize one or more species in the chemical precursor. For example, as illustrated in FIG. 3, a chemical precursor (P) flows through, over, or near a heating element 250, such as a resistively-heated conducting filament suspended near or above a surface of a substrate 225 resting on a substrate holder 220. The heating element 250 is elevated to a heat source temperature where the chemical precursor (P) decomposes into molecular fragments (X* and Y*). The molecular fragments can adsorb on the substrate where surface reaction may take place. For example, the heating element 250 may be elevated to a heat source temperature ranging from about 500 degrees C. to about 1500 degree C. Additionally, for example, the heating element 250 may be elevated to a heat source temperature ranging from about 500 degrees C. to about 1300 degree C.

Thereafter, the method may comprise maintaining the substrate 225 at a substrate temperature sufficiently high to induce deposition and film formation of the gaseous phase molecular fragments on the substrate 225. The substrate holder 220 may be configured to maintain the substrate 225 at a substrate temperature of about 20 degrees C. or greater. Dependent upon the application, the substrate temperature may have an upper limit. For example, the upper limit for the substrate temperature may be selected to be less than the thermal decomposition temperature of another layer that pre-exists on the substrate 225.

When depositing a Si-containing material, for example, the substrate holder 220 may be configured to maintain the substrate at a substrate temperature of about 20 degrees C. to about 350 degrees C. Furthermore, the substrate holder 220 may be configured to maintain the substrate at a substrate temperature of about 80 degrees C. to about 350 degrees C. Further yet, the substrate holder 220 may be configured to maintain the substrate at a substrate temperature of about 150 degrees C. to about 230 degrees C.

When depositing an organic material, for example, the substrate holder 220 may be configured to maintain the substrate at a substrate temperature of about 20 degrees C. to about 300 degrees C. Additionally, the substrate holder 220 may be configured to maintain the substrate at a substrate temperature of about 60 degrees C. to about 270 degrees C. Further yet, the substrate holder 220 may be configured to maintain the substrate at a substrate temperature of about 80 degrees C. to about 200 degrees C. Furthermore, the substrate holder 220 may be configured to maintain the substrate at a substrate temperature of about 110 degrees C. to about 180 degrees C.

In 140, a thin film, such as a Si-containing material, or an organic material, or a graded organosilicon-containing material is deposited upon the substrate 225. The Si-containing material may have a dielectric constant of less than about 3 as-deposited.

When preparing a graded organosilicon-containing material, the process gas includes a Si-containing chemical precursor and an organic chemical precursor. During the depositing of the graded organosilicon-containing material, an amount of the Si-containing chemical precursor relative to an amount of the organic chemical precursor is adjusted to spatially vary relative concentrations of Si-containing material and organic material through a thickness of the graded organosilicon-containing material. The adjustment may take place in a step-wise manner, and/or it may take place gradually (e.g., ramp a relative amount up or down).

As described above, the method may comprise disposing a heating element in the chemical vapor deposition system, wherein the process gas, including the chemical precursor, flows through, over, or by the heating element 250. For example, the temperature of the heating element 250 is elevated such that when the chemical precursor flows through, over, or by the heating element 250, the chemical precursor may decompose into two or more molecular fragments. The fragments of the chemical precursor can adsorb on the substrate 225 where surface reaction may take place.

The heating element may comprise a filament composed of a tungsten-containing material, a tantalum-containing material, a molybdenum-containing material, a rhenium-containing material, a rhodium-containing material, a platinum-containing material, a chromium-containing material, an iridium-containing material, or a nickel-containing material, or a combination thereof. The temperature range for the heating element depends on the material properties of the heating element. For example, the temperature of the heating element may range from about 500 degrees C. to about 1500 degrees C. Additionally, for example, the temperature of the heating element may range from about 500 degrees C. to about 1300 degrees C.

During and/or following the deposition of the thin film, the thin film may be treated. The thin film may be cured to, for example, improve the mechanical properties (e.g., Young's modulus, hardness, etc.). Additionally, the thin film may be treated to, for example, partly or fully remove a pore-generating molecule from a Si-containing material. Furthermore, the thin film may be treated to, for example, decompose an organic material and remove the organic material. For example, the treatment may be performed in-situ (within the same process chamber for the deposition process) during and/or after the deposition process. Additionally, example, the treatment may be performed ex-situ (outside of the process chamber for the deposition process) after the deposition process.

During and/or following the deposition of thin film, the thin film may be exposed to an energy source. The energy source may comprise a coherent source of electro-magnetic radiation, such as a laser, or a non-coherent source of electromagnetic radiation, such as a lamp, or both. Additionally, the energy source may comprise a photon source, an electron source, a plasma source, a microwave radiation source, an ultraviolet (UV) radiation source, an infrared (IR) radiation source, a visible radiation source, or a thermal energy source, or any combination of two or more thereof.

As an example, a Si-containing material may be treated, wherein the treatment produces a Si-containing material having a dielectric constant less than or equal to about 2.7. As another example, a Si-containing material may be treated, wherein the treatment produces a Si-containing thin material having a porosity of at least 5% by volume. As yet another example, an organic material may be treated, wherein the treatment removes about 90% or more of the organic material.

Figure 4:
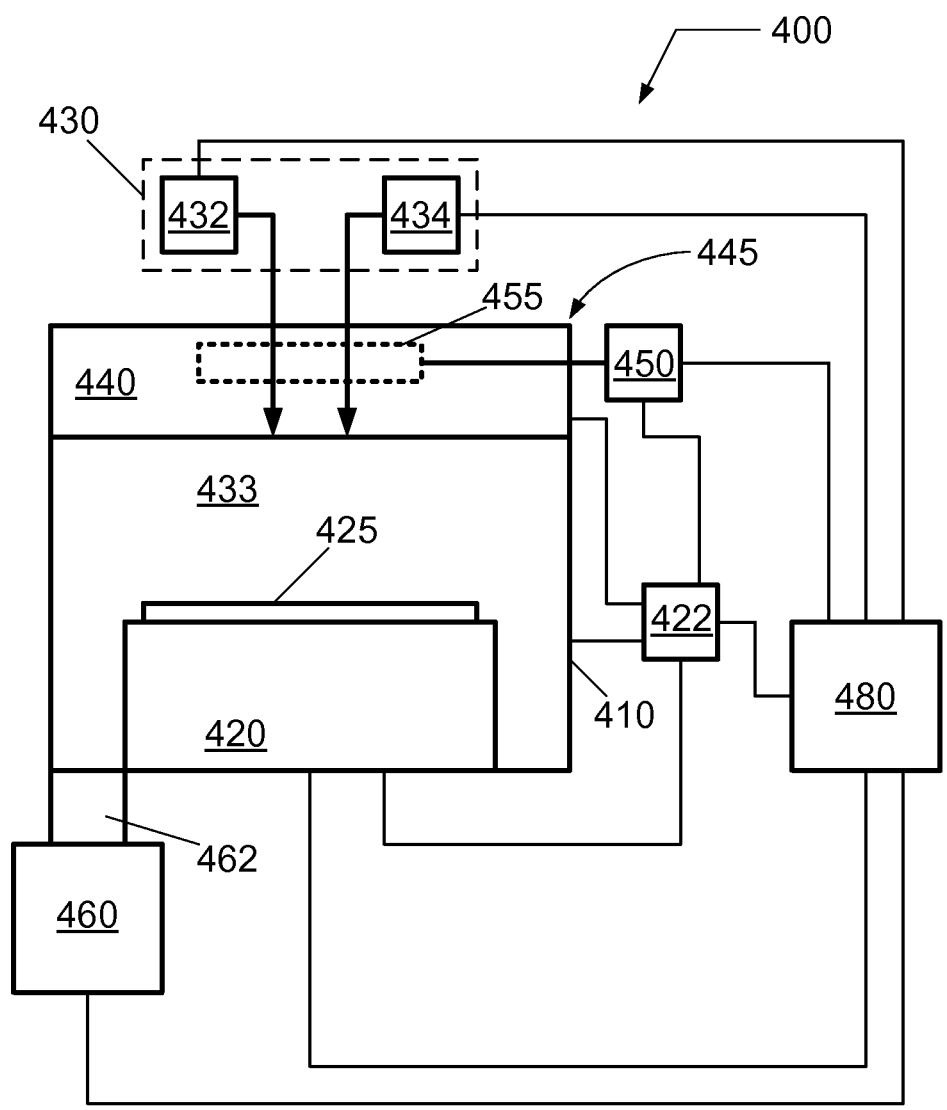
FIG. 4 is a schematic cross-sectional view of a chemical vapor deposition system according to an embodiment.

According to an embodiment, FIG. 4 schematically illustrates a chemical vapor deposition system 400 for depositing a thin film, such as a Si-containing material, or an organic material, or a graded organosilicon-containing material. For example, the thin film may be utilized as an inter-level dielectric layer in a metal interconnect or as a cap layer in connection with an air gap structure for use in a metal interconnect. Additionally, for example, the thin film may be utilized as a sacrificial layer in connection with an air gap structure. Furthermore, for example, the thin film may be utilized as a transition layer between a cap layer and a sacrificial layer in connection with an air gap structure. Chemical vapor deposition system 400 can include a chemical vapor deposition (CVD) system, whereby a film forming composition that includes a Si-containing chemical precursor or an organic chemical precursor or both is thermally activated or decomposed in order to form a thin film on a substrate.

The chemical vapor deposition system 400 comprises a process chamber 410 having a substrate holder 420 configured to support a substrate 425, upon which the thin film is deposited or formed. Furthermore, the substrate holder 420 is configured to control the temperature of the substrate 425 at a temperature suitable for the film forming reactions.

The process chamber 410 is coupled to a film forming composition delivery system 430 configured to introduce a film forming composition or process gas to the process chamber 410 through a gas distribution system 440. Furthermore, a gas heating device 445 is coupled to the gas distribution system 440 and configured to chemically modify the film forming composition or process gas. The gas heating device 445 comprises one or more heating elements 455 configured to interact with one or more constituents in the process gas, and a power source 450 that is coupled to the one or more heating elements 455 and is configured to deliver power to the one or more heating elements 455. For example, the one or more heating elements 455 can comprise one or more resistive heating elements. When electrical current flows through and affects heating of the one or more resistive heating elements, the interaction of these heated elements with one or more constituents in the process gas causes pyrolysis of one or more constituents of the process gas.

The process chamber 410 is further coupled to a vacuum pumping system 460 through a duct 462, wherein the vacuum pumping system 460 is configured to evacuate the process chamber 410 and the gas distribution system 440 to a pressure suitable for forming the thin film on the substrate 425 and suitable for pyrolysis of the process gas. The pressure in process chamber 410 may range up to about 500 torr. Alternatively, the pressure in process chamber 410 may range up to about 100 torr. Alternatively yet, the pressure in process chamber 410 may range from about 0.5 torr to about 40 torr.

The film forming composition delivery system 430 can include one or more material sources configured to introduce the process gas to the gas distribution system 440. For example, the process gas may include one or more gases, or one or more vapors formed in one or more gases, or a mixture of two or more thereof. The film forming composition delivery system 430 can include one or more gas sources, or one or more vaporization sources, or a combination thereof. Herein vaporization refers to the transformation of a material (normally stored in a state other than a gaseous state) from a non-gaseous state to a gaseous state. Therefore, the terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas.

When the process gas is introduced to the gas distribution system 440, one or more constituents of the process gas are subjected to pyrolysis by the gas heating device 445 described above. The process gas can include a chemical precursor or precursors that may be fragmented by pyrolysis in the gas distribution system 440. The chemical precursor or precursors may include the principal atomic or molecular species of the film desired to be produced on the substrate. For example, the chemical precursor or precursors may include each atomic element desired for the film to be deposited.

According to one embodiment, the film forming composition delivery system 430 can include a first material source 432 configured to introduce a chemical precursor, to the gas distribution system 440, and a second material source 434 configured to introduce an optional inert gas, a carrier gas or a dilution gas. For example, the inert gas, carrier gas or dilution gas can include a noble gas, i.e., He, Ne, Ar, Kr, Xe, or Rn.

The one or more heating elements 455 can comprise one or more resistive heating elements. Additionally, for example, the one or more heating elements 455 may include a metal-containing ribbon or filament. Furthermore, for example, the one or more heating elements 455 can be composed of a resistive metal, a resistive metal alloy, a resistive metal nitride, or a combination of two or more thereof. The one or more heating elements 455 may comprise a filament or ribbon composed of a tungsten-containing material, a tantalum-containing material, a molybdenum-containing material, a rhenium-containing material, a rhodium-containing material, a platinum-containing material, a chromium-containing material, an iridium-containing material, or a nickel-containing material, or a combination thereof.

When the power source 450 couples electrical power to the one or more heating elements 455, the one or more heating elements 455 may be elevated to a temperature sufficient to pyrolize one or more constituents of the process gas. Power source 450 may include a direct current (DC) power source, or it may include an alternating current (AC) power source. Power source 450 may be configured to couple electrical power to the one or more heating elements 455 through a direct electrical connection to the one or more heating elements 455. Alternatively, power source 450 may be configured to couple electrical power to the one or more heating elements 455 through induction. Furthermore, for example, the power source 450 can be configured to modulate the amplitude of the power, or pulse the power. Furthermore, for example, the power source 450 can be configured to perform at least one of setting, monitoring, adjusting or controlling a power, a voltage, or a current.

Referring still to FIG. 4, a temperature control system 422 can be coupled to the gas distribution system 440, the gas heating device 445, the process chamber 410 and/or the substrate holder 420, and configured to control the temperature of one or more of these components. The temperature control system 422 can include a temperature measurement system configured to measure the temperature of the gas distribution system 440 at one or more locations, the temperature of the gas heating device 445 at one or more locations, the temperature of the process chamber 410 at one or more locations and/or the temperature of the substrate holder 420 at one or more locations. The measurements of temperature can be used to adjust or control the temperature at one or more locations in chemical vapor deposition system 400.

The temperature measuring device, utilized by the temperature measurement system, can include an optical fiber thermometer, an optical pyrometer, a band-edge temperature measurement system as described in pending U.S. patent application Ser. No. 10/168,544, filed on Jul. 2, 2002, the contents of which are incorporated herein by reference in their entirety, or a thermocouple such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

Alternatively, when measuring the temperature of one or more resistive heating elements, the electrical characteristics of each resistive heating element can be measured. For example, two or more of the voltage, current or power coupled to the one or more resistive heating elements can be monitored in order to measure the resistance of each resistive heating element. The variations of the element resistance can arise due to variations in temperature of the element which affects the element resistivity.

According to program instructions from the temperature control system 422 or controller 480 or both, the power source 450 can be configured to operate the gas heating device 445, e.g., the one or more heating elements, at a temperature ranging up to approximately 1500 degrees C. For example, the temperature can range from approximately 500 degrees C. to approximately 1500 degrees C. Additionally, for example, the temperature can range from approximately 500 degrees C. to approximately 1300 degrees C. The temperature can be selected based upon the process gas and, more particularly, the temperature can be selected based upon a constituent of the process gas, such as the chemical precursor(s).

Additionally, according to program instructions from the temperature control system 422 or the controller 480 or both, the temperature of the gas distribution system 440 can be set to a value less than the temperature of the gas heating device 445, i.e., the one or more heating elements. The temperature can be selected to be less than the temperature of the one or more heating elements, and to be sufficiently high to prevent condensation which may or may not cause film formation on surfaces of the gas distribution system and reduce the accumulation of residue.

Additionally yet, according to program instructions from the temperature control system 422 or the controller 480 or both, the temperature of the process chamber 410 can be set to a value less than the temperature of the heat source 445, i.e., the one or more heating elements. The temperature can be selected to be less than the temperature of the one or more resistive film heating elements, and to be sufficiently high to prevent condensation which may or may not cause film formation on surfaces of the process chamber and reduce the accumulation of residue.

Once the process gas enters the process space 433, constituents of the process gas adsorbs on the substrate surface, and film forming reactions proceed to produce a thin film on the substrate 425. According to program instructions from the temperature control system 422 or the controller 480 or both, the substrate holder 420 is configured to set the temperature of substrate 425 to a value less than the temperature of the gas heating device 445.

As an example, for Si-containing materials, the substrate temperature can be greater than approximately 20 degrees C. Additionally, for example, the substrate temperature may range from about 20 degrees C. to about 350 degrees C. Additionally, for example, the substrate temperature may range from about 80 degrees C. to about 350 degrees C. Furthermore, for example, the substrate temperature may range from about 100 degrees C. to about 300 degrees C. Further yet, the substrate temperature may range from about 150 degrees C. to about 230 degrees C.

As another example, for organic materials, the substrate temperature can be greater than approximately 20 degrees C. Additionally, for example, the substrate temperature may range from about 80 degrees C. to about 200 degrees C. Furthermore, for example, the substrate temperature may range from about 110 degrees C. to about 180 degrees C.

The substrate holder 420 comprises one or more temperature control elements coupled to the temperature control system 422. The temperature control system 422 can include a substrate heating system, or a substrate cooling system, or both. For example, substrate holder 420 can include a substrate heating element or substrate cooling element (not shown) beneath the surface of the substrate holder 420. For instance, the heating system or cooling system can include a re-circulating fluid flow that receives heat from substrate holder 420 and transfers heat to a heat exchanger system (not shown) when cooling, or transfers heat from the heat exchanger system to the substrate holder 420 when heating. The cooling system or heating system may include heating/cooling elements, such as resistive heating elements, or thermo-electric heaters/coolers located within substrate holder 420. Additionally, the heating elements or cooling elements or both can be arranged in more than one separately controlled temperature zone. The substrate holder 420 may have two thermal zones, including an inner zone and an outer zone. The temperatures of the zones may be controlled by heating or cooling the substrate holder thermal zones separately.

Additionally, the substrate holder 420 comprises a substrate clamping system (e.g., electrical or mechanical clamping system) to clamp the substrate 425 to the upper surface of substrate holder 420. For example, substrate holder 420 may include an electrostatic chuck (ESC).

Furthermore, the substrate holder 420 can facilitate the delivery of heat transfer gas to the back-side of substrate 425 via a backside gas supply system to improve the gas-gap thermal conductance between substrate 425 and substrate holder 420. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 425.

Vacuum pumping system 460 can include a turbo-molecular vacuum pump (TMP) capable of a pumping speed up to approximately 5000 liters per second (and greater) and a gate valve for throttling the chamber pressure. For example, a 1000 to 3000 liter per second TMP can be employed. TMPs can be used for low pressure processing, typically less than approximately 1 Torr. For high pressure processing (i.e., greater than approximately 1 Torr), a mechanical booster pump and/or a dry roughing pump can be used. Furthermore, a device for monitoring chamber pressure (not shown) can be coupled to the process chamber 410. The pressure measuring device can be, for example, a capacitance manometer.

Referring still to FIG. 4, the chemical vapor deposition system 400 can further comprise controller 480 that comprises a microprocessor, memory, and a digital I/O port capable of generating control voltages sufficient to communicate and activate inputs to chemical vapor deposition system 400 as well as monitor outputs from chemical vapor deposition system 400. Moreover, controller 480 can be coupled to and can exchange information with the process chamber 410, the substrate holder 420, the temperature control system 422, the film forming composition supply system 430, the gas distribution system 440, the gas heating device 445, and the vacuum pumping system 460, as well as the backside gas delivery system (not shown), and/or the electrostatic clamping system (not shown). A program stored in the memory can be utilized to activate the inputs to the aforementioned components of chemical vapor deposition system 400 according to a process recipe in order to perform the method of depositing a thin film.

Controller 480 may be locally located relative to the chemical vapor deposition system 400, or it may be remotely located relative to the chemical vapor deposition system 400 via an internet or intranet. Thus, controller 480 can exchange data with the chemical vapor deposition system 400 using at least one of a direct connection, an intranet, or the internet. Controller 480 may be coupled to an intranet at a customer site (i.e., a device maker, etc.), or coupled to an intranet at a vendor site (i.e., an equipment manufacturer). Furthermore, another computer (i.e., controller, server, etc.) can access controller 480 to exchange data via at least one of a direct connection, an intranet, or the internet.

The chemical vapor deposition system 400 can be periodically cleaned using an in-situ cleaning system (not shown) coupled to, for example, the process chamber 410 or the gas distribution system 440. Per a frequency determined by the operator, the in-situ cleaning system can perform routine cleanings of the chemical vapor deposition system 400 in order to remove accumulated residue on internal surfaces of chemical vapor deposition system 400. The in-situ cleaning system can, for example, comprise a radical generator configured to introduce chemical radical capable of chemically reacting and removing such residue. Additionally, for example, the in-situ cleaning system can, for example, include an ozone generator configured to introduce a partial pressure of ozone. For instance, the radical generator can include an upstream plasma source configured to generate oxygen or fluorine radical from oxygen ($O_2$), nitrogen trifluoride ($NF_3$), $O_3$, $XeF_2$, $ClF_3$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

Figure 5:
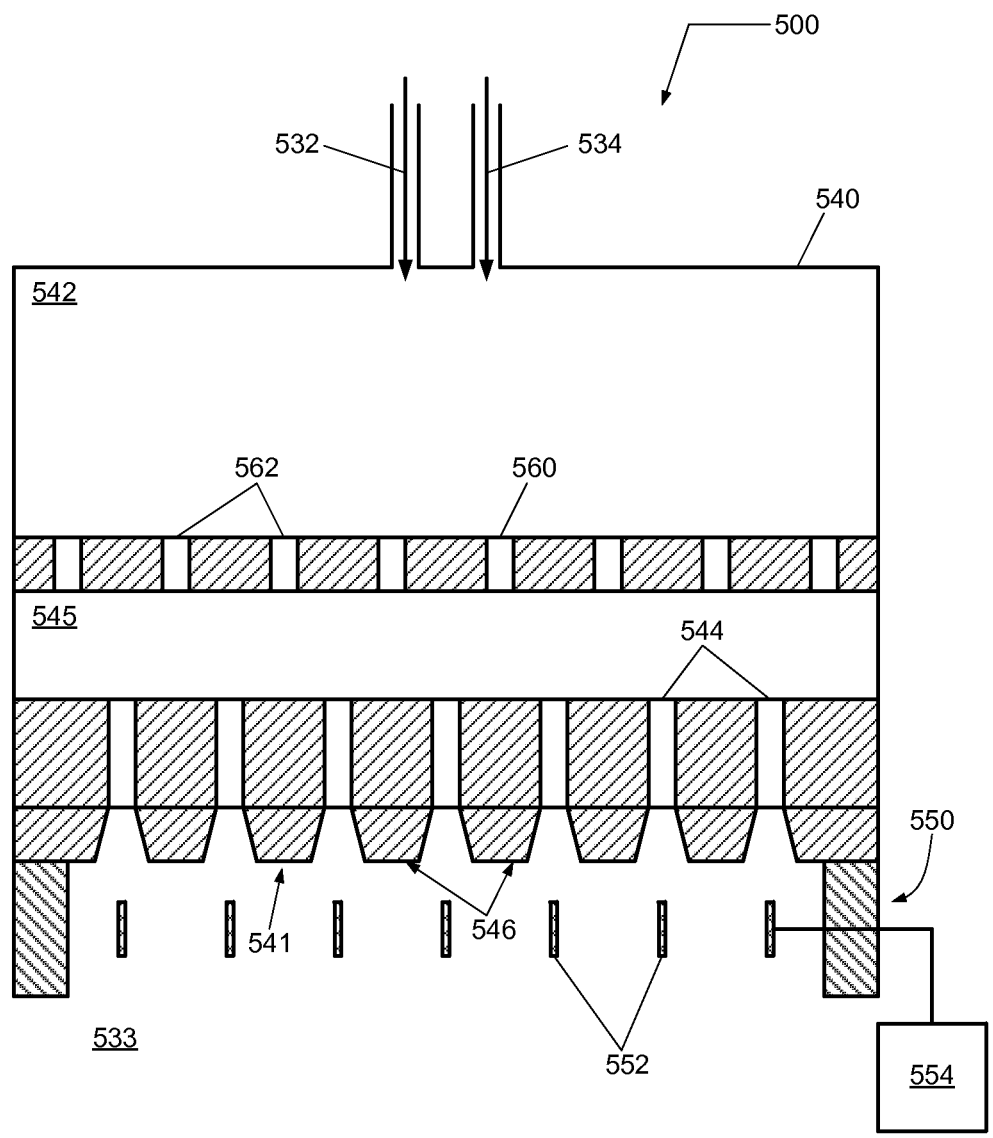
FIG. 5 provides a schematic cross-sectional view of a gas distribution system according to an embodiment.

Referring now to FIG. 5, a gas distribution system 500 is illustrated according to an embodiment. The gas distribution system 500 comprises a housing 540 configured to be coupled to or within a process chamber of a deposition system (such as process chamber 410 of chemical vapor deposition system 400 in FIG. 4), and a gas distribution plate 541 configured to be coupled to the housing 540, wherein the combination form a plenum 542. The gas distribution system 500 may be thermally insulated from the process chamber, or it may not be thermally insulated from the process chamber.

The gas distribution system 500 is configured to receive a film forming composition or process gas into the plenum 542 from a film forming composition delivery system (not shown) and distribute the film forming composition in the process chamber. For example, the gas distribution system 500 can be configured to receive one or more constituents of a film forming composition 532, such as a chemical precursor, and an optional inert gas 534 into plenum 542 from the film forming composition delivery system. The one or more constituents of the film forming composition 532 and the optional inert gas 534 may be introduced to plenum 542 separately as shown, or they may be introduced through the same opening.

The gas distribution plate 541 comprises a plurality of openings 544 arranged to introduce and distribute the film forming composition from plenum 542 to a process space 533 proximate a substrate (not shown) upon which a film is to be formed. For example, gas distribution plate 541 comprises an outlet 546 configured to face the upper surface of a substrate. Furthermore, for example, the gas distribution plate 541 may include gas showerhead.

Furthermore, the gas distribution system 500 comprises a gas heating device 550 having one or more heating elements 552 coupled to a power source 554 and configured to receive an electrical current from the power source 554. The one or more heating elements 552 are located at the outlet 546 of the gas distribution system 500, such that they may interact with any constituent of the film forming composition, or all of the constituents of the film forming composition.

For example, the one or more heating elements 552 can comprise one or more resistive heating elements. Additionally, for example, the one or more heating elements 552 may include a metal-containing ribbon or a metal-containing wire. Furthermore, for example, the one or more heating elements 552 can be composed of a resistive metal, a resistive metal alloy, a resistive metal nitride, or a combination of two or more thereof.

When the power source 554 couples electrical power to the one or more heating elements 552, the one or more heating elements 552 may be elevated to a temperature sufficient to pyrolyze one or more constituents of the film forming composition. Power source 554 may include a direct current (DC) power source, or it may include an alternating current (AC) power source. Power source 554 may be configured to couple electrical power to the one or more heating elements 552 through a direct electrical connection to the one or more heating elements 552. Alternatively, power source 554 may be configured to couple electrical power to the one or more heating elements 552 through induction.

The one or more openings 544 formed in gas distribution plate 541 can include one or more orifices, one or more nozzles, or one or more slots, or a combination thereof. The one or more openings 544 can include a plurality of orifices distributed on the gas distribution plate 541 in a rectilinear pattern. Alternatively, the one or more openings 544 can include a plurality of orifices distributed on the gas distribution plate 541 in a circular pattern (e.g., orifices are distributed in a radial direction or angular direction or both). When the one or more heating elements 552 are located at the outlet 546 of the gas distribution system 500, each heating element can be positioned such that the flow of film forming composition exiting from the one or more openings 544 of gas distribution plate 541 pass by or over each heating element.

Additionally, the plurality of openings 544 can be distributed in various density patterns on the gas distribution plate 541. For example, more openings can be formed near the center of the gas distribution plate 541 and less openings can be formed near the periphery of the gas distribution plate 541.

Alternatively, for example, more openings can be formed near the periphery of the gas distribution plate 541 and less openings can be formed near the center of the gas distribution plate 541. Additionally yet, the size of the openings can vary on the gas distribution plate 541. For example, larger openings can be formed near the center of the gas distribution plate 541 and smaller openings can be formed near the periphery of the gas distribution plate 541. Alternatively, for example, smaller openings can be formed near the periphery of the gas distribution plate 541 and larger openings can be formed near the center of the gas distribution plate 541.

Referring still to FIG. 2, the gas distribution system 500 may comprise an optional intermediate gas distribution plate 560 coupled to housing 540 such that the combination of housing 540, intermediate gas distribution plate 560 and gas distribution plate 541 form an intermediate plenum 545 separate from plenum 542 and between the intermediate gas distribution plate 260 and the gas distribution plate 241. The gas distribution system 500 is configured to receive a film forming composition into the plenum 542 from a film forming composition delivery system (not shown) and distribute the film forming composition through the intermediate plenum 545 to the process chamber.

The intermediate gas distribution plate 560 comprises a plurality of openings 562 arranged to distribute and introduce the film forming composition to the intermediate plenum 545. The plurality of openings 562 can be shaped, arranged, distributed or sized as described above.

In alternative embodiments, the gas distribution system may include a gas ring, a gas nozzle, an array of gas nozzles, or combinations thereof.

According to an example, a Si-containing material and, in particular, an organosilicate glass (OSG), is deposited using a CVD method as described above, referred to in these examples as a filament-assisted CVD (FACVD) method. In the exemplary FACVD method, the Si-containing chemical precursor comprises DEMS introduced to a flow of helium (He), and the process conditions are as follows: a Si-containing chemical precursor flow rate of about 100 mg/min (milligrams per minute); a carrier gas flow rate of about 25 sccm (standard cubic centimeters per minute); a heat source temperature (i.e., for the heating element) ranging from about 959 degrees C. to about 1020 degrees C.; a pressure of about 6 torr; a substrate holder temperature of about 278 degrees C. to about 294 degrees C.; and a distance between the heat source and the substrate of about 50.8 mm (millimeters).

Figure 6A:
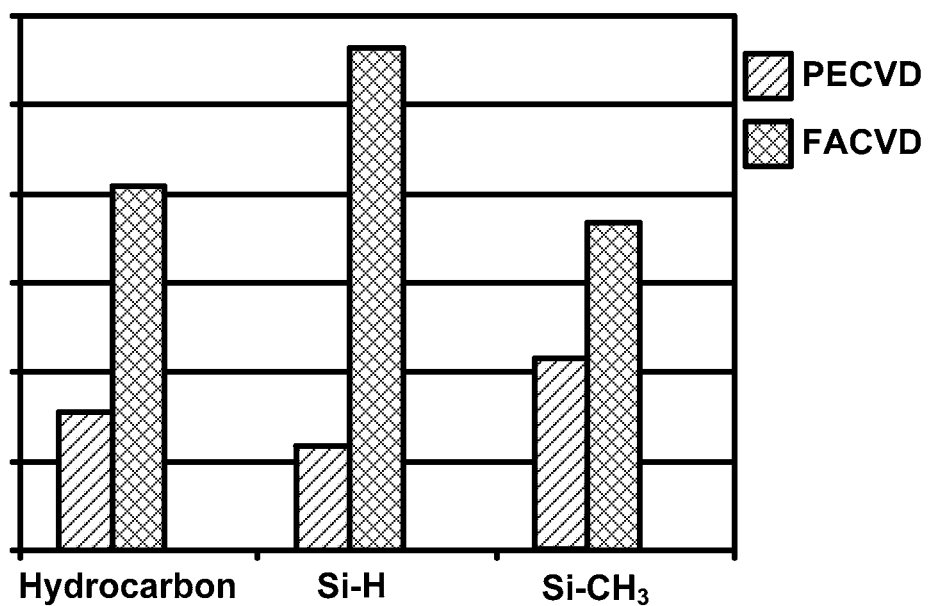
FIGS. 6A and 6B provide exemplary data for depositing a Si-containing film.

In FIG. 6A, the FACVD-deposited Si-containing material is compared to a conventional PECVD-deposited Si-containing material. In particular, the relative amount of hydrocarbon, Si—H bonds, and SiCH$_3$ bonds are provided for both the FACVD-deposited material and the PECVD-deposited material.

Figure 6B:
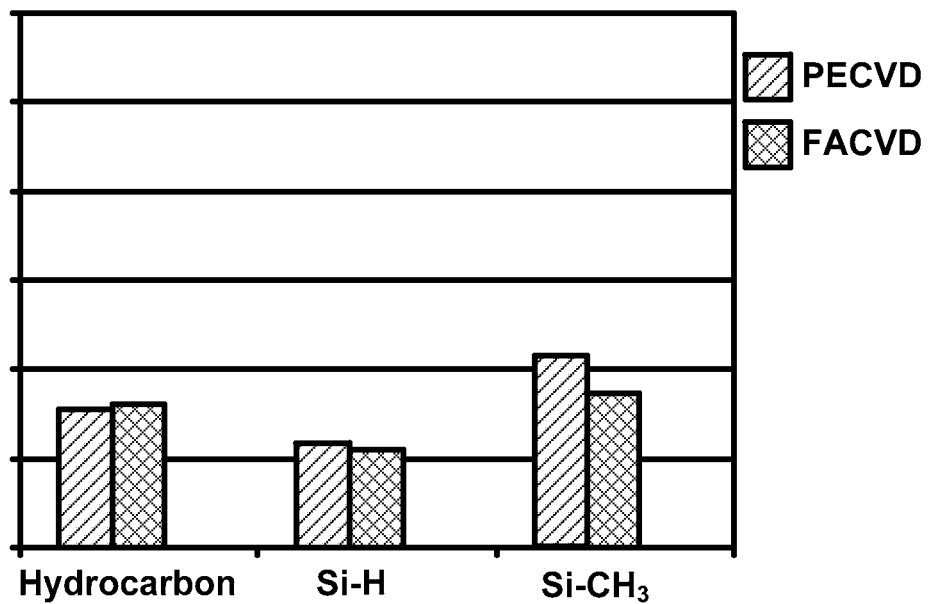

Referring now to FIG. 6B, the FACVD-deposited Si-containing material is compared to the conventional PECVD-deposited Si-containing material following curing of the FACVD-deposited material. During the curing process, the FACVD-deposited material is exposed to ultraviolet (UV) radiation for about 2 minutes. As evident in FIG. 6B, the chemical composition of the FACVD-deposited material and the PECVD-deposited material are similar.

Figure 7:
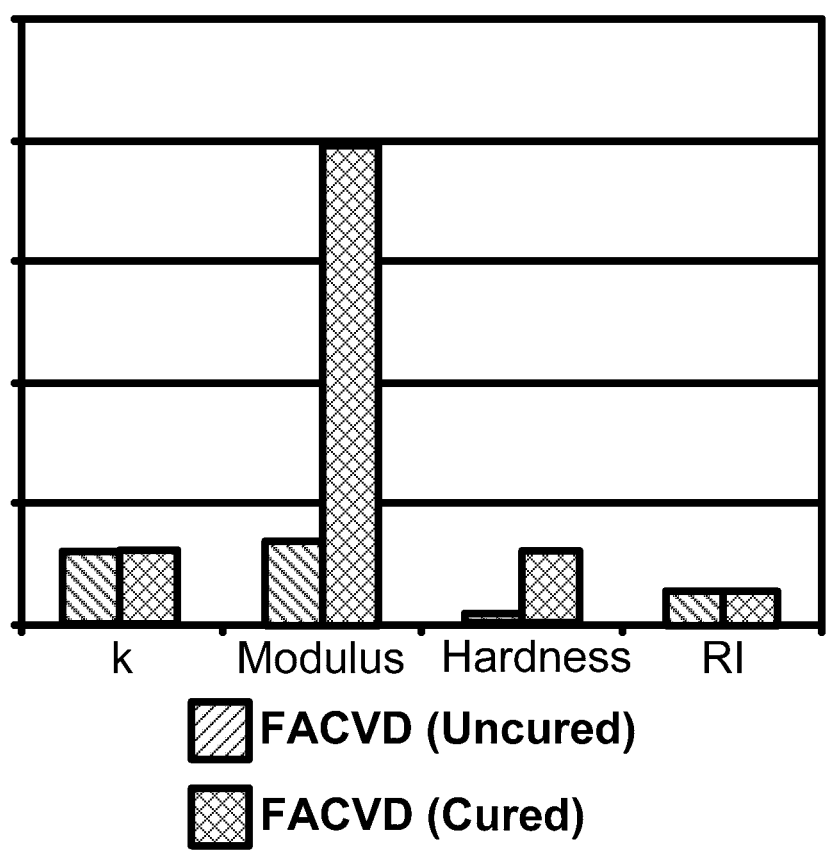
FIG. 7 provides exemplary data for depositing a Si-containing material.

Referring now to FIG. 7, several film properties are compared for the uncured FACVD-deposited material and the cured FACVD-deposited material. In particular, the dielectric constant (k), the modulus (E), the hardness (H), and the refractive index (RI) are provided. As evident in FIG. 7, the curing process has a dramatic effect on the mechanical properties of the film, wherein both the modulus and the hardness are significantly increased.

Figure 8:
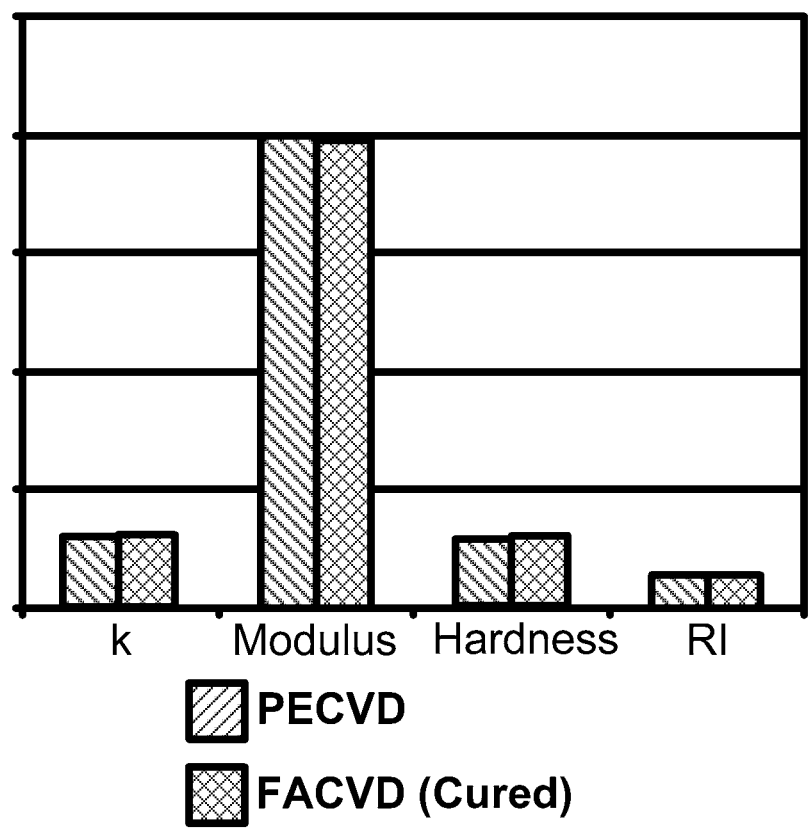
FIG. 8 provides exemplary data for depositing a Si-containing material.

Referring now to FIG. 8, these film properties are compared between the PECVD-deposited material and the cured FACVD-deposited material. As evident in FIG. 8, the measured values for k, E, H, and RI are similar for both the PECVD-deposited material and the cured FACVD-deposited material.

According to another example, a Si-containing material and, in particular, an organosilicate glass (OSG), is deposited using a FACVD method as described above. In the exemplary FACVD method, the Si-containing chemical precursor comprises methyltrioxysilane (MTES) and the porogen comprises para-cymene (PCM) introduced to a flow of helium (He), and the process conditions are as follows: a Si-containing chemical precursor flow rate of about 30 mg/min (milligrams per minute) to about 100 mg/min; a porogen flow rate of about 70 mg/min to about 300 mg/min; a carrier gas flow rate of about 25 sccm (standard cubic centimeters per minute) to about 100 sccm; a heat source temperature (i.e., for a Ta heating element) ranging from about 499 degrees C. to about 952 degrees C.; a pressure of about 6 torr to about 10 torr; a substrate holder temperature of about 61 degrees C. to about 221 degrees C.; and a distance between the heat source and the substrate of about 19 mm (millimeters) to about 57 mm.

According to another example, a Si-containing material and, in particular, an organosilicate glass (OSG), is deposited using a filament-assisted CVD process (FACVD) as described above. In the exemplary FACVD process, the Si-containing chemical precursor comprises methyltrioxysilane and the porogen comprises para-cymene introduced to a flow of helium (He), and the process conditions are as follows: a Si-containing chemical precursor flow rate of about 30 mg/min (milligrams per minute) to about 100 mg/min; a porogen flow rate of about 70 mg/min to about 300 mg/min; a carrier gas flow rate of about 25 sccm (standard cubic centimeters per minute) to about 50 sccm; a heat source temperature (i.e., for a Ni—Cr alloy (e.g., Nichrome®) heating element) ranging from about 715 degrees C. to about 895 degrees C.; a pressure of about 4 torr to about 12 torr; a substrate holder temperature of about 61 degrees C. to about 198 degrees C.; and a distance between the heat source and the substrate of about 19 mm (millimeters) to about 44 mm.

Table 1 illustrates a comparison of film properties between cured FACVD-deposited material using DEMS and cured FACVD-deposited material using MTES/PCM.

TABLE 1

| Chemical precursor | k | E (Gpa) | H (Gpa) |
|---|---|---|---|
| DEMS | 2.4 | 6.5 | 1.2 |
| MTES/PCM | 2.27 | 6.1 | 0.89 |

As evident in Table 1, the measured values for k, E, and H are similar for both cured FACVD-deposited materials; however, marginally lower dielectric constant (k) for MTES/PCM.

The inventors have also discovered that pressure and carrier gas dilution (e.g., He) may be used to alter film morphology and film shrinkage. For example, lower pressure and lower dilution (i.e., lower carrier gas flow rate) tend to improve film morphology. Furthermore, lower pressure and a Nichrome heating element (relative to a Ta heating element) tend to favor reduced film shrinkage following curing.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A chemical vapor deposition method for depositing a thin film on a surface, comprising:
    disposing a substrate on a substrate holder in a process chamber;
    introducing a process gas to said process chamber, wherein said process gas comprises a Si-containing chemical precursor;
    exposing said one or more chemical precursors to a non-ionizing heat source separate from said substrate holder to cause decomposition of said one or more chemical precursors; exposing said substrate to said decomposition of said one or more chemical precursors;
    depositing a thin film upon said substrate, said thin film containing a material selected from the group consisting of a Si-containing material, a graded organosilicon-containing material, or a mixture thereof; and
    maintaining said substrate at a substrate temperature from about 150 degrees C. to about 230 degrees C.

2. The method of claim 1, wherein said Si-containing material has a dielectric constant of less than about 3.0 as deposited.

3. The method of claim 1, wherein said Si-containing chemical precursor comprises a Si-containing structure-forming molecule and a pore-generating molecule.

4. The method of claim 3, wherein said pore-generating molecule is bonded to said Si-containing structure-forming molecule as a side group, or said pore-generating molecule is not bonded to said Si-containing structure-forming molecule.

5. The method of claim 3, further comprising:
    exposing said Si-containing material to an energy source to partly or fully remove said pore-generating molecule from said Si-containing material.

6. The method of claim 5, wherein said exposing said Si-containing material to said energy source is performed during said depositing said Si-containing material, or following said depositing said Si-containing material, or both during said depositing and following said depositing.

7. The method of claim 5, wherein said Si-containing material has a dielectric constant less than or equal to about 2.7 following said exposing said Si-containing material to said energy source.

8. The method of claim 5, wherein said Si-containing material comprises a porous material having a porosity of at least 5% by volume following said exposing said Si-containing material to said energy source.

9. The method of claim 5, wherein said energy source comprises a coherent source of electro-magnetic radiation, or a non-coherent source of electro-magnetic radiation, or both.

10. The method of claim 5, wherein said energy source comprises a photon source, an electron source, a plasma source, a microwave radiation source, an ultraviolet radiation source, an infrared radiation source, a visible radiation source, or a thermal energy source, or any combination of two or more thereof.

11. The method of claim 1, wherein said Si-containing chemical precursor comprises:
    $R^1_n(OR^2)_{4-n}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated; and n is 1 to 3;
    $R^1_n(OR^2)_{3-n}Si-O-SiR^3_m(OR^4)_{3-m}$, where $R^1$ and $R^3$ can be independently H, $C_1$ to $C_4$, linear or branched, saturated, singly or multiply unsaturated, cyclic, partially or fully fluorinated; $R^2$ and $R^4$ can be independently $C_1$ to $C_6$, linear or branched, saturated, singly or multiply unsaturated, cyclic, aromatic, partially or fully fluorinated; n is 1 to 3; and m is 1 to 3;
    $R^1_n(OR^2)_{3-n}Si-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently $C_1$ to $C_6$, linear or branched, saturated, singly or multiply unsaturated, cyclic, aromatic, partially or fully fluorinated; n is 1 to 3; and m is 1 to 3;
    $R^1_n(O(O)CR^2)_{4-n}Si$ where $R^1$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated; and n is 1 to 3;
    $R^1_n(O(O)CR^2)_{3-n}Si-O-SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated; n is 1 to 3; and m is 1 to 3;
    $R^1_n(O(O)CR^2)_{3-n}Si-SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated; n is 1 to 3; and m is 1 to 3;
    $R^1_n(O(O)CR^2)_{3-n}Si-O-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated; $R^4$ can be independently $C_1$ to $C_6$, linear or branched, saturated, singly or multiply unsaturated, cyclic, aromatic, partially or fully fluorinated; n is 1 to 3; and m is 1 to 3;
    $R^1_n(O(O)CR^2)_{3-n}Si-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated; $R^4$ can be independently $C_1$ to $C_6$, linear or branched, saturated, singly or multiply unsaturated, cyclic, aromatic, partially or fully fluorinated; n is 1 to 3; and m is 1 to 3;
    $R^1_n(OR^2)_p(O(O)CR^4)_{4-(n+p)}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated; $R^4$ can be independently H, $C_1$ to $C_6$, linear or branched, saturated, singly or multiply unsaturated, cyclic, aromatic, partially or fully fluorinated; n is 1 to 3; and p is 1 to 3;
    $R^1_n(OR^2)_p(O(O)CR^4)_{3-n-p}Si-O-SiR^3_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$ and $R^6$ can be independently $C_1$ to $C_6$, linear or branched, saturated, singly or multiply unsaturated, cyclic, aromatic, partially or fully fluorinated; $R^4$ and $R^5$ can be independently H, $C_1$ to $C_6$, linear or branched, saturated, singly or multiply unsaturated, cyclic, aromatic, partially or fully fluorinated; n is 1 to 3; m is 1 to 3; p is 1 to 3; and q is 1 to 3;

cyclic siloxanes of the formula $(OSiR^1R^2)_x$, where $R^1$ and $R^2$ can be independently H, $C_1$ to $C_4$, linear or branched, saturated, singly or multiply unsaturated, cyclic, partially or fully fluorinated; and x may be any integer from 2 to 8;

$R^1{}_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; $R^3$ is independently H, $C_1$ to $C_6$ linear or branched, saturated, singly or multiply unsaturated, cyclic, aromatic, partially or fully fluorinated hydrocarbon; n is 1 to 3; and p is 0 to 3;

$R^1{}_n(OR^2)_p(O(O)CR^4)_{3-n-p}Si\text{—}O\text{—}SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon; $R^4$ and $R^5$ are independently H, $C_1$ to $C_6$ linear or branched, saturated, singly or multiply unsaturated, cyclic, aromatic, partially or fully fluorinated hydrocarbon; n is 0 to 3; m is 0 to 3; q is 0 to 3; and p is 0 to 3; provided that $n+m \geq 1$, $n+p \leq 3$ and $m+q \leq 3$;

$R^1{}_n(OR^2)_p(O(O)CR^4)_{3-n-p}Si\text{—}SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon; $R^4$ and $R^5$ are independently H, $C_1$ to $C_6$ linear or branched, saturated, singly or multiply unsaturated, cyclic, aromatic, partially or fully fluorinated hydrocarbon; n is 0 to 3; m is 0 to 3; q is 0 to 3; and p is 0 to 3; provided that $n+m \geq 1$, $n+p \leq 3$ and $m+q \leq 3$;

$R^1{}_n(OR^2)_p(O(O)CR^4)_{3-n-p}Si\text{—}R^7\text{—}SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon; $R^4$ and $R^5$ are independently H, $C_1$ to $C_6$ linear or branched, saturated, singly or multiply unsaturated, cyclic, aromatic, partially or fully fluorinated hydrocarbon; n is 0 to 3; m is 0 to 3; q is 0 to 3; and p is 0 to 3; provided that $n+m \geq 1$, $n+p \leq 3$, and $m+q \leq 3$;

$(R^1{}_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; $R^3$ is independently H, $C_1$ to $C_6$ linear or branched, saturated, singly or multiply unsaturated, cyclic, aromatic, partially or fully fluorinated hydrocarbon; n is 1 to 3; p is 0 to 3; and t is 2 to 4; provided that $n+p \leq 4$;

$(R^1{}_n(OR^2)_p(O(O)CR^3)_{4-(n+p)}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; $R^3$ is independently H, $C_1$ to $C_6$ linear or branched, saturated, singly or multiply unsaturated, cyclic, aromatic, partially or fully fluorinated hydrocarbon; n is 1 to 3; p is 0 to 3; and t is 1 to 3; provided that $n+p \leq 4$;

cyclic siloxanes of the formula $(OSiR^1R^2)_x$, where $R^1$ and $R^2$ are independently H, $C_1$ to $C_4$, linear or branched, saturated, singly or multiply unsaturated, cyclic, partially or fully fluorinated, and x may be any integer from 2 to 8;

cyclic silazanes of the formula $(NR_1SiR^1R^2)_x$, where $R^1$ and $R^2$ are independently H, $C_1$ to $C_4$, linear or branched, saturated, singly or multiply unsaturated, cyclic, partially or fully fluorinated, and x may be any integer from 2 to 8;

cyclic carbosilanes of the formula $[(CR^1R^2)(SiR^1R^2)]_x$, where $R^1$ and $R^2$ are independently H, $C_1$ to $C_4$, linear or branched, saturated, singly or multiply unsaturated, cyclic, partially or fully fluorinated, and x may be any integer from 2 to 8; or any combination of two or more thereof.

12. The method of claim 1, wherein said Si-containing chemical precursor is mixed with a porogen, or said Si-containing chemical precursor has a porogen attached thereto, or said Si-containing chemical precursor is mixed with a porogen and has a porogen attached thereto.

13. The method of claim 1, wherein said Si-containing chemical precursor comprises:
diethoxymethylsilane;
dimethyldimethoxysilane;
methyltriethoxysilane;
1,3-dimethyl-1,3-diethoxydisiloxane;
1,2-dimethyl-1,1,2,2-tetraethoxydisiloxane;
dimethyldiacetoxysilane;
1,3-dimethyl-1,3-diacetoxydisiloxane;
1,2-dimethyl-1,1,2,2-tetraacetoxydisilane;
1,3-dimethyl-1-acetoxy-3-ethoxydisiloxane;
1,2-dimethyl-1-acetoxy-2-ethoxydisilane;
di-t-butoxymethylsilane;
methylacetoxy-t-butoxysilane;
1,3-dimethyl-1,3-diacetoxy-1,3-diethoxydisiloxane;
1,2-dimethyl-1,2-diacetoxy-1,2-diethoxydisilane;
1,3,5,7-tetramethylcyclotetrasiloxane; or
octamethylcyclotetrasiloxane; or
any combination of two or more thereof.

14. The method of claim 1, wherein said Si-containing chemical precursor comprises a Si-containing structure-forming molecule and a pore-generating molecule, and wherein said pore-generating molecule comprises:
cyclic hydrocarbons of the general formula $C_nH_{2n}$, where n=4-14, where the number of carbons in the cyclic structure is between 4 and 10, and where there can be a plurality of simple or branched hydrocarbons substituted onto the cyclic structure;
linear or branched, saturated, singly or multiply unsaturated hydrocarbons of the general formula $C_nH_{(2n+2)-2y}$, where n=2-20, and where y=0-n;

singly or multiply unsaturated cyclic hydrocarbons of the general formula $C_nH_{2n-2x}$ where x is the number of unsaturated sites in the molecule, n=4-14, where the number of carbons in the cyclic structure is between 4 and 10, where there can be a plurality of simple or branched hydrocarbons substituted onto the cyclic structure, and where the unsaturation can be located inside endocyclic or on one of the hydrocarbon substituents to the cyclic structure;

bicyclic hydrocarbons of the general formula $C_nH_{2n-2}$, where n=4-14, where the number of carbons in the bicyclic structure is between 4 and 12, and where there can be a plurality of simple or branched hydrocarbons substituted onto the cyclic structure;

multiply unsaturated bicyclic hydrocarbons of the general formula $C_nH_{2n-(2+2x)}$ where x is the number of unsaturated sites in the molecule, n=4-14, where the number of carbons in the bicyclic structure is between 4 and 12, where there can be a plurality of simple or branched hydrocarbons substituted onto the cyclic structure, and where the unsaturation can be located inside endocyclic or on one of the hydrocarbon substituents to the cyclic structure;

tricyclic hydrocarbons of the general formula $C_nH_{2n-4}$, where n=4-14, where the number of carbons in the tricyclic structure is between 4 and 12, and where there can be a plurality of simple or branched hydrocarbons substituted onto the cyclic structure;

substituted alkyl-aromatic structures of the general formula $C_6H_nR'_xR''_{6-(n+x)}$ where R' and R'' can be independently selected from 1-3 carbon species;

substituted aromatic species; or any combination of two or more thereof.

15. The method of claim 14, wherein said pore-generating molecule comprises:

methylisopropylbenzene;
para-cymene;
ethyltoluene;
para-ethyltoluene;
para-xylene;
meta-xylene;
ortho-xylene;
ethylbenzene;
propylbenzene;
toluene;
diethylbenzene;
cyclohexane;
trimethylcyclohexane;
1-methyl-4(1-methylethyl)cyclohexane;
cyclooctane;
methylcyclooctane;
cyclooctadiene;
decahydronaphthalene;
ethylene;
propylene;
acetylene;
neohexane;
cyclohexane;
vinylcyclohexane;
dimethylcyclohexene;
t-butylcyclohexene;
alpha-terpinene;
pinene;
limonene;
1,5-dimethyl-1,5-cyclooctadiene;
2,5-dimethyl-2,4-hexadiene;
vinyl-cyclohexene;
bicycloheptadiene;
norbornane;
spiro-nonane;
camphene;
norbornene;
norbornadiene;
adamantane; or
any combination of two or more thereof.

16. The method of claim 1, wherein said process gas does not contain an oxidizing gas, or an initiator, or both.

17. The method of claim 1, wherein said process gas further comprises an inert gas.

18. The method of claim 1, wherein said process gas further comprises an inert gas, and an oxidizing gas, or an initiator, or both an oxidizing gas and an initiator.

19. The method of claim 18, wherein said initiator comprises di-tert-butyl peroxide.

20. The method of claim 1, wherein said non-ionizing heat source comprises a resistively-heated conducting filament suspended near or above a surface of said substrate, and wherein said process gas is introduced to said process chamber such that said one or more chemical precursors flows through, over, or near said resistively-heated conducting filament.

21. The method of claim 20, wherein a temperature of said non-ionizing heat source ranges from about 500° C. to about 1500° C.

22. The method of claim 1, further comprising:
curing said material deposited on said substrate.

23. The method of claim 1, further comprising:
adjusting an amount of said Si-containing chemical precursor relative to an amount of an organic chemical precursor to spatially vary relative concentrations of Si-containing material and organic material through a thickness of said graded organosilicon-containing material.

* * * * *